(12) United States Patent
Alshinnawi et al.

(10) Patent No.: US 9,820,411 B2
(45) Date of Patent: Nov. 14, 2017

(54) REVERSIBLE FAN DIRECTION CONTROL RESPONSIVE TO DEVICE ENCLOSURE ORIENTATION

(71) Applicant: Lenovo Enterprise Solutions (Singapore) Pte. Ltd., Singapore (SG)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 841 days.

(21) Appl. No.: 14/050,741

(22) Filed: Oct. 10, 2013

(65) Prior Publication Data

US 2015/0105009 A1    Apr. 16, 2015

(51) Int. Cl.
*H05K 7/20* (2006.01)
(52) U.S. Cl.
CPC ..... *H05K 7/20836* (2013.01); *H05K 7/20736* (2013.01)
(58) Field of Classification Search
CPC ........................................................ H05K 7/20
USPC ........................................................ 454/184
See application file for complete search history.

(56) References Cited

U.S. PATENT DOCUMENTS 7,492,591 B1 *   2/2009   Aybay ................ H05K 7/20581
                                                                  312/236
7,698,095 B2    4/2010   Chung
7,729,116 B1    6/2010   Aybay et al.
8,320,120 B1   11/2012   Chan et al.
9,060,451 B2 *   6/2015   Clidaras ............. H05K 7/20745
9,405,301 B2 *   8/2016   Montero ................. G06F 1/206

(Continued)

FOREIGN PATENT DOCUMENTS

JP    60251331 A    12/1985
JP    4103952 B2     6/2008

OTHER PUBLICATIONS

Masoero et al., "Case Study Summary: Heat Pumping and Reversible Air Conditioning—Italy Case Study N°2: Reversible air-air VRF HP system in a refurbished 19th Century office building", International Energy Agency ECBS, IEA-ECBCS Annex 48, http://www.ecbcs-48.org, Mar. 2010, 4 pages.

*Primary Examiner* — Steven B. McAllister
*Assistant Examiner* — Samantha Miller
(74) *Attorney, Agent, or Firm* — Jeffrey L. Streets

(57) ABSTRACT

A method and computer program product are provided for controlling the airflow direction through a device enclosure. A first device enclosure is positioned adjacent a second device enclosure, wherein both enclosures have an airflow pathway extending from the front to the back, and a fan for moving air through the airflow pathway, wherein the fan of the first device enclosure is a reversible rotary fan. The method automatically determines whether the first device enclosure is in a first orientation with its front facing in the same direction as the front of the adjacent second device enclosure or in a second orientation with the front facing in the same direction as the back of the adjacent second device enclosure. The airflow direction imparted by a reversible rotary fan is then controlled according to the determined orientation of the first device enclosure relative to the second device enclosure.

16 Claims, 7 Drawing Sheets

(56) References Cited

U.S. PATENT DOCUMENTS

| | | | |
|---|---|---|---|
| 2003/0053293 A1* | 3/2003 | Beitelmal | G06F 1/206 361/679.49 |
| 2004/0264124 A1* | 12/2004 | Patel | H05K 7/20736 361/679.46 |
| 2009/0152216 A1* | 6/2009 | Champion | G06F 1/183 211/26 |
| 2010/0110632 A1* | 5/2010 | Rose | H05K 7/20727 361/695 |
| 2010/0296915 A1 | 11/2010 | Suzuki | |
| 2011/0058334 A1* | 3/2011 | Takemoto | H05K 7/20172 361/695 |
| 2012/0086379 A1 | 4/2012 | Horng et al. | |
| 2012/0145803 A1 | 6/2012 | Cislo | |
| 2013/0042639 A1 | 2/2013 | Kobayashi et al. | |
| 2013/0067944 A1 | 3/2013 | Kibo et al. | |
| 2013/0130610 A1* | 5/2013 | Unno | G06F 1/20 454/184 |
| 2015/0099449 A1 | 4/2015 | Chen | |

* cited by examiner

REVERSIBLE FAN DIRECTION CONTROL RESPONSIVE TO DEVICE ENCLOSURE ORIENTATION

BACKGROUND

Field of the Invention

The present invention relates to methods and system for controlling the airflow through a device enclosure that is part of a computer system.

Background of the Related Art

A data center is a facility where computer equipment and related infrastructure are consolidated for centralized operation and management. Computer equipment may be interconnected in a datacenter to produce large, powerful computer systems that are capable of meeting the computing requirements of entities that store and process large amounts of data, such as corporations, web hosting services, and Internet search engines. A data center may house any number of racks, with each rack capable of holding numerous modules of computer equipment. The computer equipment typically includes a large number of rack-mounted servers along with supporting equipment, such as switches, power supplies, network communications interfaces, environmental controls, and security devices. These devices are typically mounted in racks in a compact, high-density configuration to make efficient use of space while providing physical access and enabling the circulation of cool air.

An important aspect of operating a datacenter is the provision of adequate cooling to each and every device. The large amount of rack-mounted computer equipment in a datacenter may collectively generate a large amount of heat. The infrastructure provided in a datacenter includes a cooling system capable of removing the large quantity of heat generated by the rack-mounted computer equipment. The cooling system in many installations will also include a particular arrangement of equipment racks into alternating hot aisles and cold aisles, and a computer room air conditioner ("CRAC") capable of supplying chilled air to the cold aisles. Meanwhile, fans within individual device enclosures move the chilled air through the racks to remove heat from the computer equipment and exhaust the heated air into the hot aisles.

BRIEF SUMMARY

One embodiment of the present invention provides a method for controlling the airflow direction through a device enclosure. A first device enclosure is positioned adjacent a second device enclosure, wherein both of the first and second device enclosures have a front, a back, an airflow pathway extending through the device enclosure from the front to the back, and a fan for moving air through the airflow pathway, wherein the fan of the first device enclosure is a reversible rotary fan. The method includes automatically determining whether a first device enclosure is oriented in a first orientation with the front of the first device enclosure facing in the same direction as the front of the adjacent second device enclosure or in a second orientation with the front of the first device enclosure facing in the same direction as the back of the adjacent second device enclosure. The reversible rotary fan of the first device enclosure is operated in a first rotational direction to move air through the first device enclosure in a first airflow direction from front to back through the airflow pathway in response to determining that the first device enclosure is in the first orientation. Conversely, the reversible rotary fan of the first device enclosure is operated in a second rotational direction to move air through the first device enclosure in a second airflow direction from the back to the front through the airflow pathway in response to determining that the first device enclosure is in the second orientation.

Another embodiment of the present invention provides a computer program product including computer readable program code embodied on a computer readable storage medium. The computer program product includes: computer readable program code for automatically determining whether a first device enclosure is oriented in a first orientation with a front of the first device enclosure facing in the same direction as a front of an adjacent second device enclosure or in a second orientation with the front of the first device enclosure facing in the same direction as a back of the adjacent second device enclosure, wherein both of the first and second device enclosures have an airflow pathway extending through the device enclosure from the front to the back and a fan for moving air through the airflow pathway, wherein the fan of the first device enclosure is a reversible rotary fan; computer readable program code for operating the reversible rotary fan of the first device enclosure in a first rotational direction to move air through the first device enclosure in a first airflow direction from front to back through the airflow pathway in response to determining that the first device enclosure is in the first orientation; and computer readable program code for operating the reversible rotary fan of the first device enclosure in a second rotational direction to move air through the first device enclosure in a second airflow direction from the back to the front through the airflow pathway in response to determining that the first device enclosure is in the second orientation.

DETAILED DESCRIPTION

Figure 1:
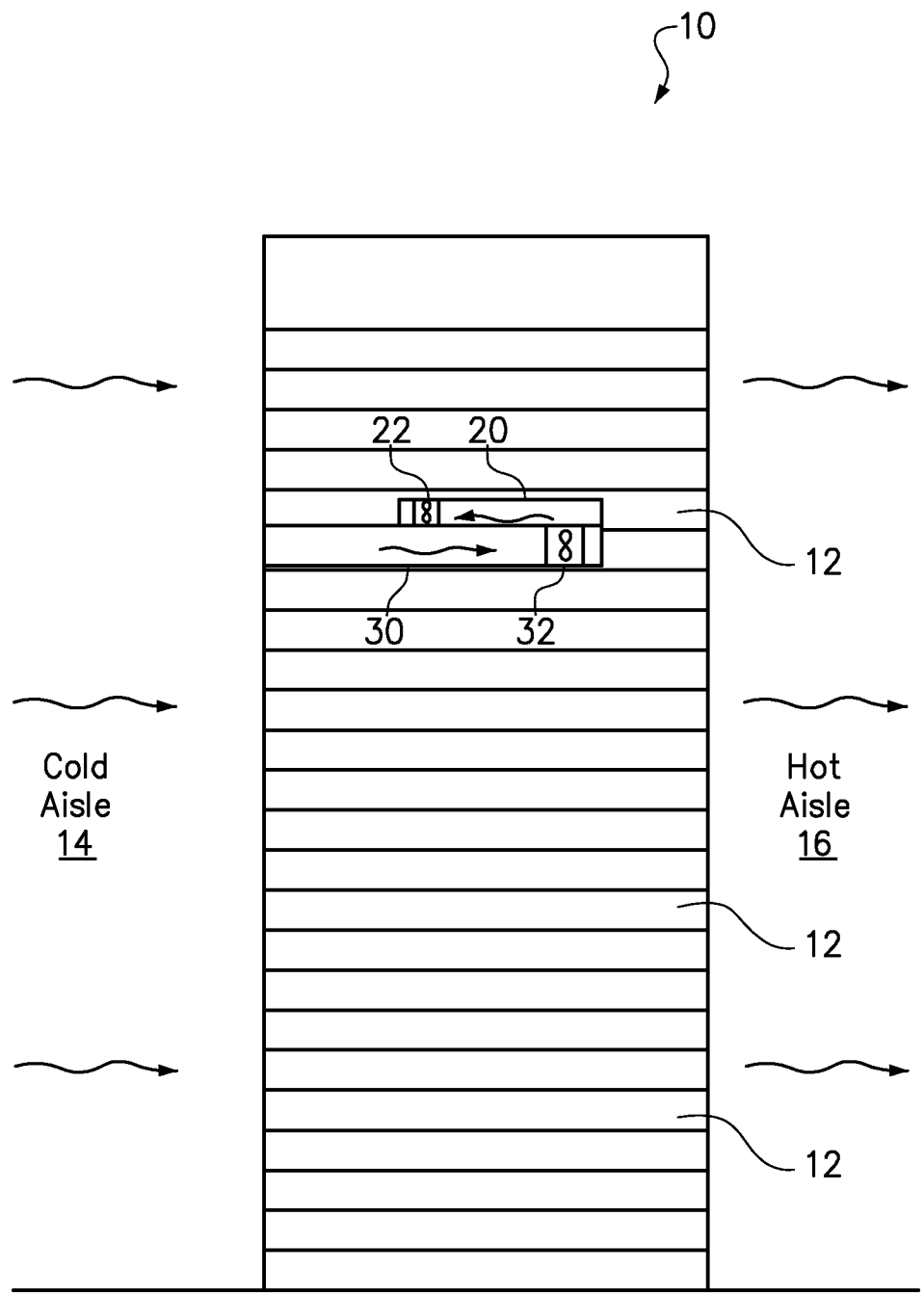
FIG. 1 is a side elevation diagram of a rack securing first and second adjacent device enclosures.

One embodiment of the present invention provides a method for controlling the airflow direction through a device enclosure. A first device enclosure is positioned adjacent a second device enclosure, wherein both of the first and second device enclosures have a front, a back, an airflow pathway extending through the device enclosure from the front to the back, and a fan for moving air through the airflow pathway, wherein the fan of the first device enclosure is a reversible rotary fan. The method includes automatically determining whether a first device enclosure is oriented in a first orientation with the front of the first device enclosure facing in the same direction as the front of the adjacent second device enclosure or in a second orientation with the front of the first device enclosure facing in the same direction as the back of the adjacent second device enclosure. The reversible rotary fan of the first device enclosure is operated in a first rotational direction to move air through the first device enclosure in a first airflow direction from front to back through the airflow pathway in response to determining that the first device enclosure is in the first orientation. Conversely, the reversible rotary fan of the first device enclosure is operated in a second rotational direction to move air through the first device enclosure in a second airflow direction from the back to the front through the airflow pathway in response to determining that the first device enclosure is in the second orientation.

Each of the device enclosures contains one or more heat generating component or system that is cooled by airflow through the device enclosure. For example, each device enclosure may contain a server or a network switch.

A further embodiment of the invention makes use of near-field communication signals to automatically determine whether the first device enclosure is oriented in the first orientation or in the second orientation. For example, the method may include transmitting a first near-field communication signal from a first transceiver positioned on the first device enclosure at a first time; receiving the first near-field communication signal at a second transceiver positioned on the adjacent second device enclosure and transmitting a second near-field communication signal from the second transceiver, and receiving the second near-field communication signal at the first transceiver at a second time. The amount of time delay between the first time and second time is a function of the distance between the first and second transceivers. The first and second transceivers should be positioned on their respective device enclosures so that the distance between the first and second transceivers if a function of the orientation of the first device enclosure relative to the second device enclosure. Preferably, the first transceiver is positioned at the front of the first device enclosure and the second transceiver is positioned at the front of the second device enclosure, or the first transceiver is positioned at the back of the first device enclosure and the second transceiver is positioned at the back of the second device enclosure. Accordingly, the first device enclosure may be determined to be oriented in the first orientation in response to the time delay between the first time and the second time being less than a predetermined amount of time (i.e., the first and second transceivers are positioned at the same end), and determined to be oriented in the second orientation in response to the time delay between the first time and the second time being greater than a predetermined amount of time (i.e., the first and second transceivers are position at opposite ends). The predetermined amount of time should be selected, such as by empirical determination, to be greater than the time delay when the first device enclosure is in the first orientation and less than the time delay when the first device enclosure is in the second orientation.

In one option, each near-field communication signal may include a characteristic or content that identifies the device enclosure position of a near-field communication transceiver that generated the near-field communication signal. For example, if a particular near-field communication transceiver is secured to the right-front corner of a device enclosure, that transceiver would transmit a near-field communication signal including a characteristic that identifies the fact that the transceiver is positioned in the right-front corner. Non-limiting examples of the characteristic include digital identification codes or a signal frequency.

In a further option, each near-field communication signal may include a characteristic or content that identifies a rack position of the device enclosure that includes the near-field communication transceiver that generated the near-field communication signal. For example, a service processor installed in each device enclosure may provide the rack position of the device enclosure to the NFC transceiver for modification of or inclusion in the near-field communication signal that is transmitted. Where an adjacent device enclosure has a transceiver that transmits a near-field communication signal that identifies the rack position of that device enclosure, it is possible for the first device enclosure identify its rack position relative to the rack position of the adjacent device enclosure.

In yet another embodiment, the first device enclosure includes one or more near-field communication transceiver along a top of the first device enclosure for transmitting and receiving near-field communication signals with a near-field transceiver on a device enclosure adjacent the top of the first device enclosure, and the first device enclosure includes one or more near-field communication transceiver along a bottom of the first device enclosure for transmitting and receiving near-field communication signals with a near-field transceiver on a device enclosure adjacent the bottom of the first device enclosure.

While embodiments of the invention are operable with a single near-field communication transceiver, other embodiments may include multiple near-field communication transceivers. For example, a device enclosure may have transceivers located in four corners of the device enclosure, or perhaps transceivers located in four top corners and four bottom corners of the device enclosure. Similarly, a device enclosure might have near-field communication transceivers located in the front, rear, left side and right side of the device enclosure. Other configurations of the transceivers may be used as well, so long as it is possible to distinguish between the first orientation and the second orientation.

In a further embodiment of the invention, a management entity obtains a system identification and the time delay from the first device enclosure, wherein the management entity is responsible for determining whether the first device enclosure is oriented in the first orientation or the second orientation. The system identification might include a system type (such as server or network switch) or a unique system identifier (such as a serial number). Still further, the management entity may provide a fan direction instruction to a fan controller in the first device enclosure for controlling the rotational direction of the reversible rotary fan. In a non-limiting alternative embodiment, a controller within the first device enclosure determines whether the first device enclosure is oriented in the first orientation or the second orientation, and controls the rotational direction of the reversible rotary fan. Such a controller may be a service processor, such as a baseboard management controller (BMC).

Still further embodiments use temperature measurements as the basis for automatically determining whether the first device enclosure is oriented in the first orientation or the second orientation. In one example, this determination includes measuring the air temperature at the front and back of the airflow pathway through the first device enclosure, determining that the first device enclosure is oriented in the first orientation in response to the air temperature at the front of the first device enclosure being less than the air temperature at the back of the first device enclosure, and determining that the first device enclosure is oriented in the second orientation in response to the air temperature at the front of the first device enclosure being greater than the air temperature at the back of the first device enclosure. One benefit of this method of determining orientation, is that the first device enclosure does not require any cooperation or interaction with any other device enclosure. The temperature difference at the front and back of the first device enclosure arises due to one end facing a cold aisle and the other end facing a hot aisle. It is the assumed that it is always desirable to draw air from the cold aisle. In fact, a method may optionally operate the reversible rotary fan of the first device enclosure to maintain airflow through the first device enclosure from a cold aisle to a hot aisle flow regardless of whether the first device enclosure is in the first orientation or the second orientation.

Another embodiment that uses temperature measurements, includes running the reversible rotary fan in a first rotational direction to move air through the first device enclosure in a first airflow direction during a first test period and measuring one or more temperatures within the first device enclosure during the first test period, and then running the reversible rotary fan in a second rotational direction to move air through the first device enclosure in a second airflow direction during a second test period and measuring one or more temperatures within the first device enclosure during the second test period. Since there is a cold aisle on one side of a rack securing the first device enclosure and a hot aisle on the other side of the rack, drawing airflow through the first device enclosure from the cold aisle will result in a cooler internal temperature, all things being equal, than drawing airflow from the hot aisle. Accordingly, the method further includes determining that the first device enclosure is oriented in the first orientation in response to the one or more temperatures measured during the first test period being less than the one or more temperatures measured during the second test period, and determining that the first device enclosure is oriented in the second orientation in response to the one or more temperatures measured during the first test period being greater than the one or more temperatures measured during the second test period.

Another embodiment of the present invention provides a computer program product including computer readable program code embodied on a computer readable storage medium. The computer program product includes: computer readable program code for automatically determining whether a first device enclosure is oriented in a first orientation with a front of the first device enclosure facing in the same direction as a front of an adjacent second device enclosure or in a second orientation with the front of the first device enclosure facing in the same direction as a back of the adjacent second device enclosure, wherein both of the first and second device enclosures have an airflow pathway extending through the device enclosure from the front to the back and a fan for moving air through the airflow pathway, wherein the fan of the first device enclosure is a reversible rotary fan; computer readable program code for operating the reversible rotary fan of the first device enclosure in a first rotational direction to move air through the first device enclosure in a first airflow direction from front to back through the airflow pathway in response to determining that the first device enclosure is in the first orientation; and computer readable program code for operating the reversible rotary fan of the first device enclosure in a second rotational direction to move air through the first device enclosure in a second airflow direction from the back to the front through the airflow pathway in response to determining that the first device enclosure is in the second orientation.

The foregoing computer program products may further include computer readable program code for implementing or initiating any one or more aspects of the methods described herein. Accordingly, a separate description of the methods will not be duplicated in the context of a computer program product.

FIG. 1 is a side elevation diagram of a rack 10 securing a first device enclosure 20 and an adjacent second device enclosure 30. The rack includes a large number of rack positions or bays 12 that are designed to receive, support and facilitate operation of a device enclosure. Each device enclosure 20, 30 includes a device that produces waste heat, such as a server or a network switch. The devices within each device enclosure 20, 30 are cooled by passing air through the device enclosures from a cold aisle 14, through an airflow pathway in the device enclosure, and out of the device enclosure to a hot aisle 16. The direction and speed of airflow through each device enclosure 20, 30 is controlled by a fan. The first device enclosure 20 is shown to have a fan 22, and the second device enclosure 30 is shown to have a fan 32. As shown in FIG. 1, the fan 32 of the second device enclosure 30 is drawing air through the enclosure from the cold aisle to the hot aisle (see wavy arrow indicating airflow direction) as desired, but the fan 22 of the device enclosure 20 is drawing air through the enclosure from the hot aisle to the cold aisle, which is typically undesired. This situation may have arisen from the first device enclosure being installed backwards from what was intended or from installing the wrong unit, model, or version of device as the first device enclosure. In either situation, the methods of the present invention may be used to automatically reverse the direction of the fan 22 so that the airflow through the first device enclosure 20 will reverse direction and drawing air from the cold aisle instead of the hot aisle.

FIGS. 2A-2D are side elevation diagrams of first (top) and second (bottom) adjacent device enclosures 20, 30, each having a fan 22, 32, respectively, that is installed near a rear end 28, 38 of the respective enclosure. Furthermore, each device enclosure 20, 30 has a single transceiver 24, 34, respectively, such as a near-field communication signal transceiver, that is installed near a front end 26, 36 of the respective enclosure.

Figure 2A:
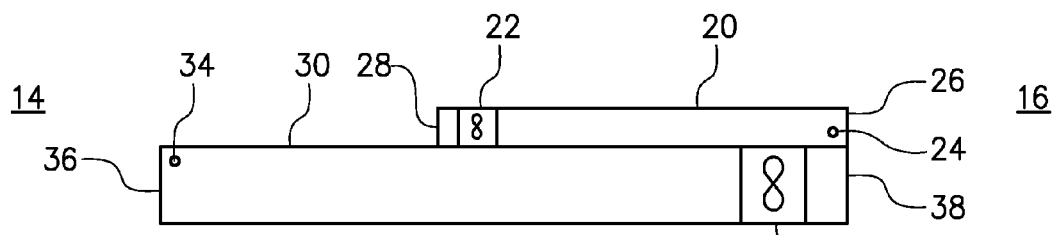
FIGS. 2A-2D are side elevation diagrams of first and second adjacent device enclosures.

In FIG. 2A, the first device enclosure 20 is oriented in an orientation that is the reverse of the second device enclosure 30. Specifically, the first device enclosure 20 has a front end 26 facing the hot aisle 16 and the second device enclosure 30 has a front end 36 facing the cold aisle 14. Note the distance between the two transceivers 24, 34.

Figure 2B:
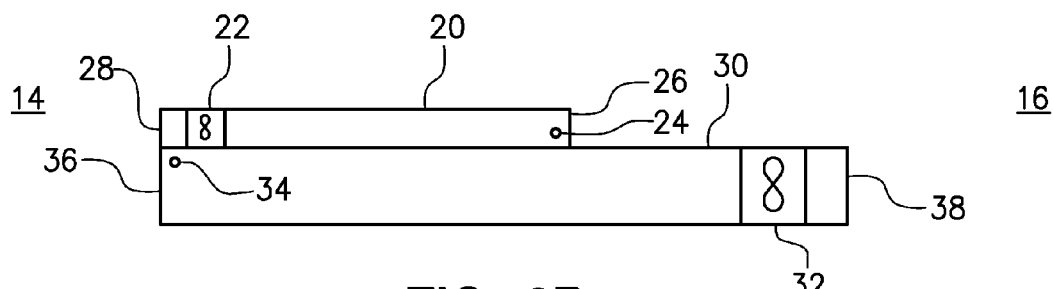

In FIG. 2B, the first device enclosure 20 is still oriented in an orientation that is the reverse of the second device enclosure 30. Specifically, the first device enclosure 20 has a front end 26 facing the hot aisle 16 and the second device enclosure 30 has a front end 36 facing the cold aisle 14. However, relative to the position shown in FIG. 2A, the first device enclosure 20 has been moved to an extreme leftward position. Thus, in FIG. 2B, the distance between the two transceivers 24, 34 is less than in FIG. 2A.

Figure 2C:
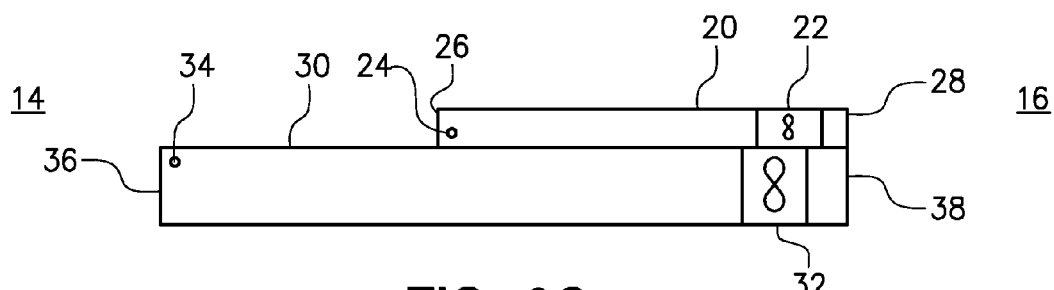

In FIG. 2C, the first device enclosure 20 is oriented in an orientation that is the same as the second device enclosure 30. Specifically, the first device enclosure 20 has a front end 26 facing the cold aisle 14 and the second device enclosure 30 also has a front end 36 facing the cold aisle 14. Note the distance between the two transceivers 24, 34.

Figure 2D:
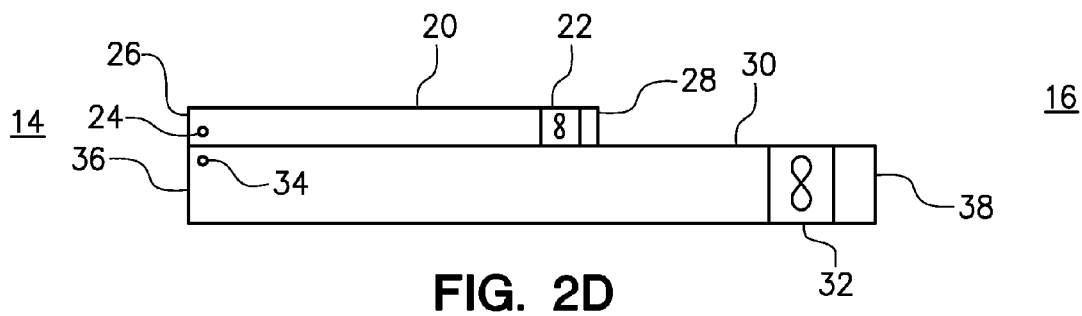

In FIG. 2D, the first device enclosure 20 is still oriented in an orientation that is the same as the second device enclosure 30. Specifically, the first device enclosure 20 has a front end 26 facing the cold aisle 14 and the second device enclosure 30 also has a front end 36 facing the cold aisle 14. However, relative to the position shown in FIG. 2C, the first device enclosure 20 has been moved to an extreme leftward position. Thus, in FIG. 2D, the distance between the two transceivers 24, 34 is less than in FIG. 2C.

If the length of the server 30 is said to be a nominalized length of 1.0, then the distance between the two transceivers 24, 34 is perhaps 0.95 in FIG. 2A, 0.6 in FIG. 2B, 0.4 in FIG. 2C, and 0.05 in FIG. 2D. Since the time delay in a signal transmitted from a first transceiver to the second transceiver and back to the first transceiver is a function of the distance between the two transceivers 24, 34, the nominalized time delay may be considered to be 0.95 in FIG. 2A, 0.6 in FIG. 2B, 0.4 in FIG. 2C, and 0.05 in FIG. 2D. Accordingly, given the lengths of the two device enclosures 20, 30, and the positioning of the two transceivers 24, 34 in or on the device enclosures, it can be concluded that a time delay that is greater than a setpoint, such as 0.5, indicates that the first device enclosure 20 is oriented in a first orientation (front-to-back; per FIGS. 2A, 2B) relative to the second device enclosure 30. Similarly, a time delay that is less than a setpoint, such as 0.5, indicates that the first device enclosure 20 is oriented in a second orientation (front-to-front; per FIGS. 2C, 2D) relative to the second device enclosure 30.

Figure 3A:
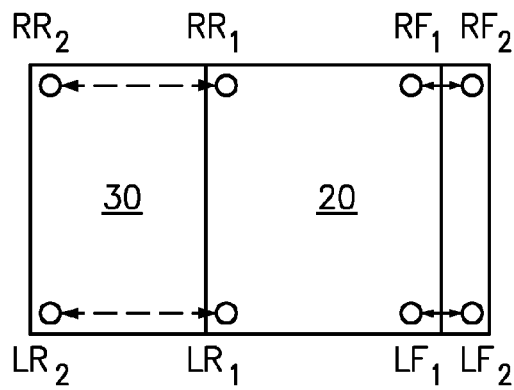
FIGS. 3A-3D are plan view diagrams of first and second adjacent device enclosures.
Figure 3B:
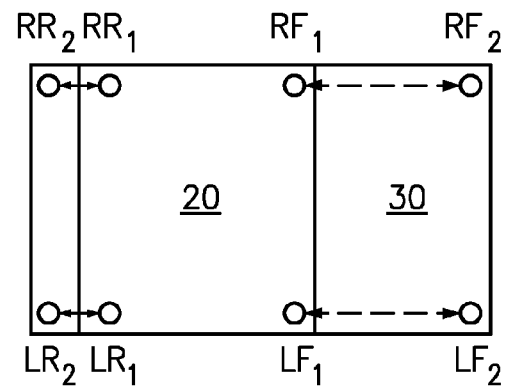

FIGS. 3A-3D are plan view diagrams of first and second adjacent device enclosures 20, 30. In the context of a rack system as shown in FIG. 1, the devices are "vertically" adjacent such that the plan views of FIGS. 3A-3B show the first device enclosure 20 on top of the second device enclosure 30. It should be recognized that the methods described herein are equally applicable to device enclosures of various sizes, including device enclosures of the same exact size.

In the embodiment shown in FIGS. 3A-3B, each device enclosure includes four transceivers positioned one transceiver in each corner. For each device enclosure, the right-front transceiver is labeled RF, the right-rear transceiver is labeled RR, the left-front transceiver is labeled LF, and the left-rear transceiver is labeled LR. A subscript is used to distinguish between the two device enclosures, with a "1" used to refer to the first device enclosure 20, and a "2" used to refer to the second device enclosure 30. Each transceiver of the first device enclosure 20 transmits a near-field communication (NFC) signal that is received by a correspondingly positioned transceiver of the second device enclosure 30. The correspondingly positioned transceiver then responds by transmitting an NFC signal back to the transceiver of the first device enclosure 20. The response time or time delay between the transmitting the first NFC signal and receiving the second NFC signal is used as a measure of relative distance between the two transceivers. Although there are other transceivers on each device enclosure 20, 30, the NFC signal transmitted by each transceiver may include a characteristic or content that identifies the position of the transceiver on a device enclosure. Accordingly, a transceiver may filter out or ignore NFC signals that are not from a correspondingly positioned transceiver.

In FIG. 3A, dashed arrows are used to illustrate NFC signals that are transmitted by the various transceivers of the first and second device enclosures 20, 30. For example, the right-rear transceiver on the first device enclosure 20 (i.e., $RR_1$) transmits an NFC signal that is received by the right-rear transceiver on the second device enclosure 30 (i.e., $RR_2$), and then receives a response NFC signal from $RR_2$. Using the notation described above and shown in FIG. 3A, similar communications may occur between $RF_1$ and $RF_2$, $LF_1$ and $LF_2$, and $LR_1$ and $LR_2$. Any one or all of the four time delays may then be used to determine the orientation of the first device enclosure 20 relative to the second device enclosure 30.

In FIGS. 3A and 3B, the first device enclosure 20 is in the same (first) orientation (front-to-front) relative to the second device enclosure 30, yet the first device enclosure is closer to the front of the second device enclosure 30 in FIG. 3A and closer to the rear of the second device enclosure 30 in FIG. 3B.

Figure 3C:
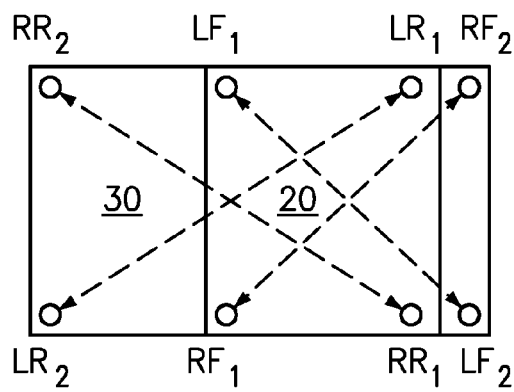
Figure 3D:
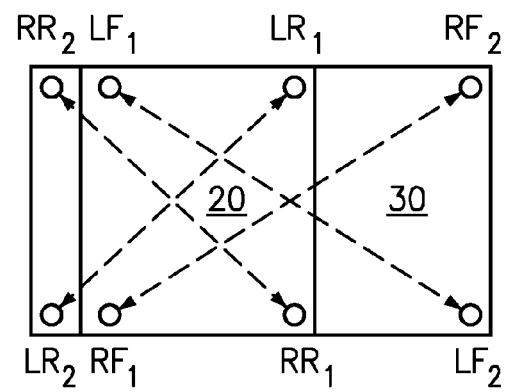

In FIGS. 3C and 3D, the first device enclosure 20 is in the reverse (second) orientation (front-to-back) relative to the second device enclosure 30, yet the first device enclosure is closer to the front of the second device enclosure 30 in FIG. 3C and closer to the rear of the second device enclosure 30 in FIG. 3D.

FIGS. 3A-3D illustrate that the NFC signal distances and associated time delays are significantly greater when the first device enclosure 20 is in the reverse (second) orientation (front-to-back) relative to the second device enclosure 30 as shown in FIGS. 3C-3D than when the first device enclosure 20 is in the same (first) orientation (front-to-front) relative to the second device enclosure 30 as shown in FIGS. 3A-3B. Accordingly, the time delay measures may be used to determine the orientation of the first device enclosure 20 relative to the second device enclosure 30. A setpoint time delay may be used to distinguish between the time delays associated with a first orientation from the time delays associated with a second orientation.

Figure 4A:
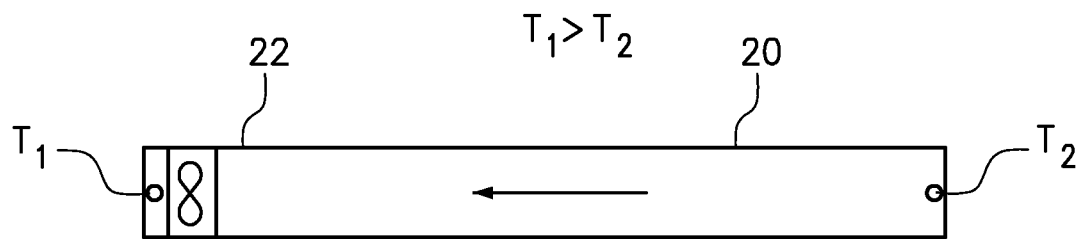
FIGS. 4A-4B are diagrams of a first device enclosure having temperature sensors near the front and rear of the first device enclosure.
Figure 4B:
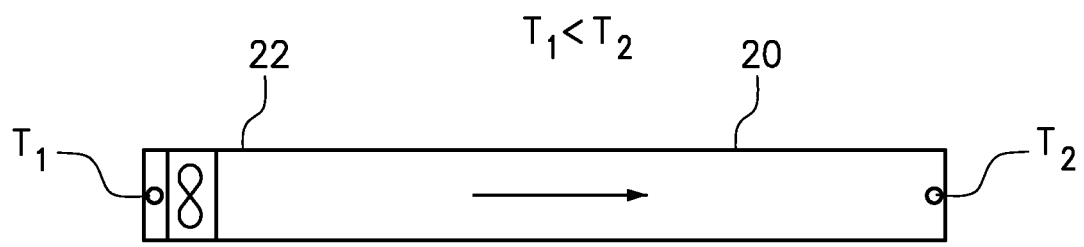

FIGS. 4A-4B are diagrams of a first device enclosure having temperature sensors near the front and rear of the first device enclosure 20. Measurements of temperature may be used as the basis for automatically determining whether the first device enclosure is oriented in the first orientation or the second orientation. In the embodiment shown, the air temperature is measured by a first temperature sensor ($T_1$) at the back of the airflow pathway through the first device enclosure and a second temperature sensor ($T_2$) at the front of the airflow pathway through the first device enclosure. These two measurements should be taken with the fan 22 turned off, such that the temperature measurements provide an indication of the ambient air temperature at each end of the first device enclosure 20. If the air temperature ($T_2$) at the front of the first device enclosure is less than the air temperature ($T_1$) at the back of the first device enclosure, then the orientation logic determines that the first device enclosure is oriented in the first orientation (front-to-front). Conversely, if the air temperature ($T_2$) at the front of the first device enclosure is greater than the air temperature ($T_1$) at the back of the first device enclosure, then the orientation logic determines that the first device enclosure is oriented in the second orientation (front to back). One benefit of this method of determining orientation, is that the first device enclosure does not require any cooperation or interaction with any other device enclosure. The arrow in FIGS. 4A-4B shows the desirable direction of airflow to be induced by the reversible fan 22.

Figure 5A:
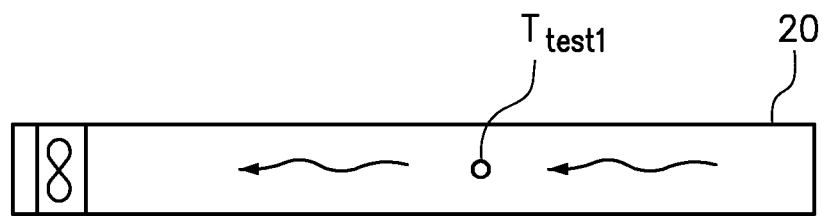
FIGS. 5A-5B are diagrams of a first device enclosure having a temperature sensors within the airflow pathway of the first device enclosure.
Figure 5B:
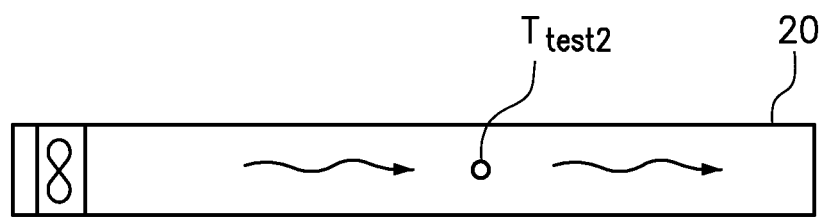

FIGS. 5A-5B are diagrams of a first device enclosure 20 having a temperature sensor within the airflow pathway of the first device enclosure. In FIG. 5A, the fan 22 is run in a first rotational direction to move air through the first device enclosure in a first airflow direction (see arrows) during a first test period while measuring a temperature ($T_{test1}$) within the first device enclosure. In FIG. 5B, the fan 22 is subsequently run in a second rotational direction to move air through the first device enclosure in a second airflow direction during a second test period while measuring the temperature ($T_{test2}$) within the first device enclosure. If $T_{test1} < T_{test2}$, then the first device enclosure is oriented in the first orientation (front-to-front), and the fan direction used in the first test period (i.e., the first rotational direction) is selected for operation. Conversely, if $T_{test1} > T_{test2}$, then the first device enclosure is oriented in the second orientation (front-to-back), and the fan direction used in the second test period (i.e., the second rotational direction) is selected for operation.

Figure 6:
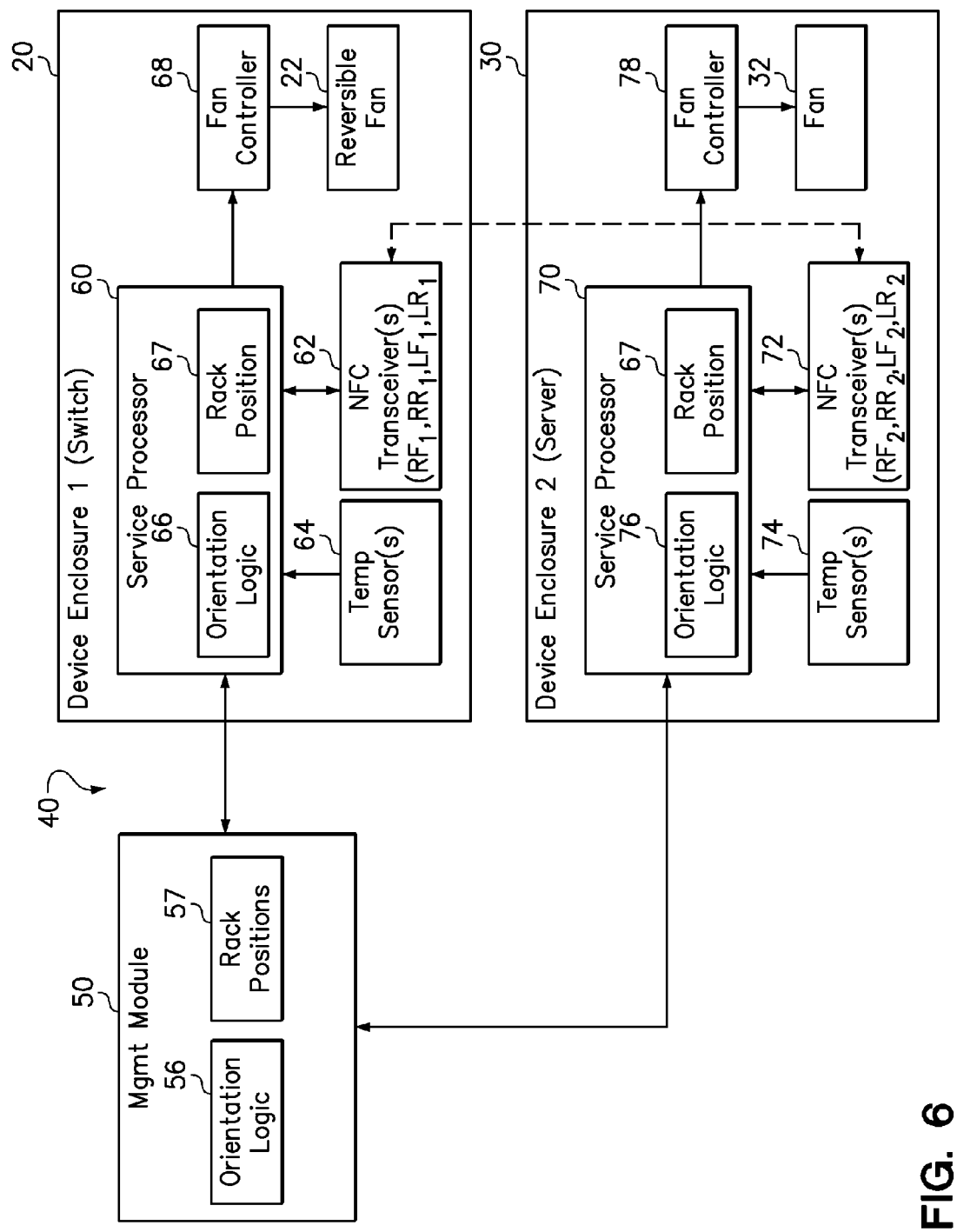
FIG. 6 is a system diagram including a management module in communication with first and second device enclosures.

FIG. 6 is a diagram of a system 40 including a management module 50 in communication with a first device enclosure 20 and a second device enclosure 30. The first and second device enclosures 20, 30 each include a service processor 60, 70. In accordance with the embodiment of FIGS. 3A-3D, the service processors may be in communication with one or more NFC transceivers 62, 72. In accordance with the embodiment of FIGS. 4A-4B or the embodiment of FIGS. 5A-5B, the service processors may be in communication with one or more temperature sensors 64, 74.

The service processors receive input from either the NFC transceivers 62, 72 or the temperature sensors 64, 74 and process that input using the orientation logic 66, 76 to determine the orientation of the device enclosure and output a fan direction instruction to the fan controller 68, 78, respectively. The fan controller 68, 78 then controls the operation of the fan 22, 32 in the selected fan direction.

While the two device enclosures 20, 30 have been shown and described as having identical configurations, this is not required. In fact, it is desirable for evaluation the orientation of one device enclosure at a time so that the two adjacent device enclosure are not both constantly trying to reverse their fan directions. Optionally, the orientation logic may be executed during the power on self test (POST) of the devices within their respective device enclosure, or the management module 50 may control when the orientation logic in each particular device enclosure may be executed.

In one alternative, the orientation logic may be executed by the management module 50 rather than the individual service processors 60, 70. The service processors may then pass along the input from the local NFC transceivers 62, 72 or the local temperature sensors 64, 74 to the management module. When the management module 50 has determined the orientation of each device enclosure, then a fan direction instruction is sent back to the service processors to share with the fan controller. Furthermore, the management module 50 may collect rack position information from each device enclosure and/or inform a device enclosure of its rack position based upon the device enclosure's relative position to an adjacent device enclosure having a known absolute rack position.

Figure 7:
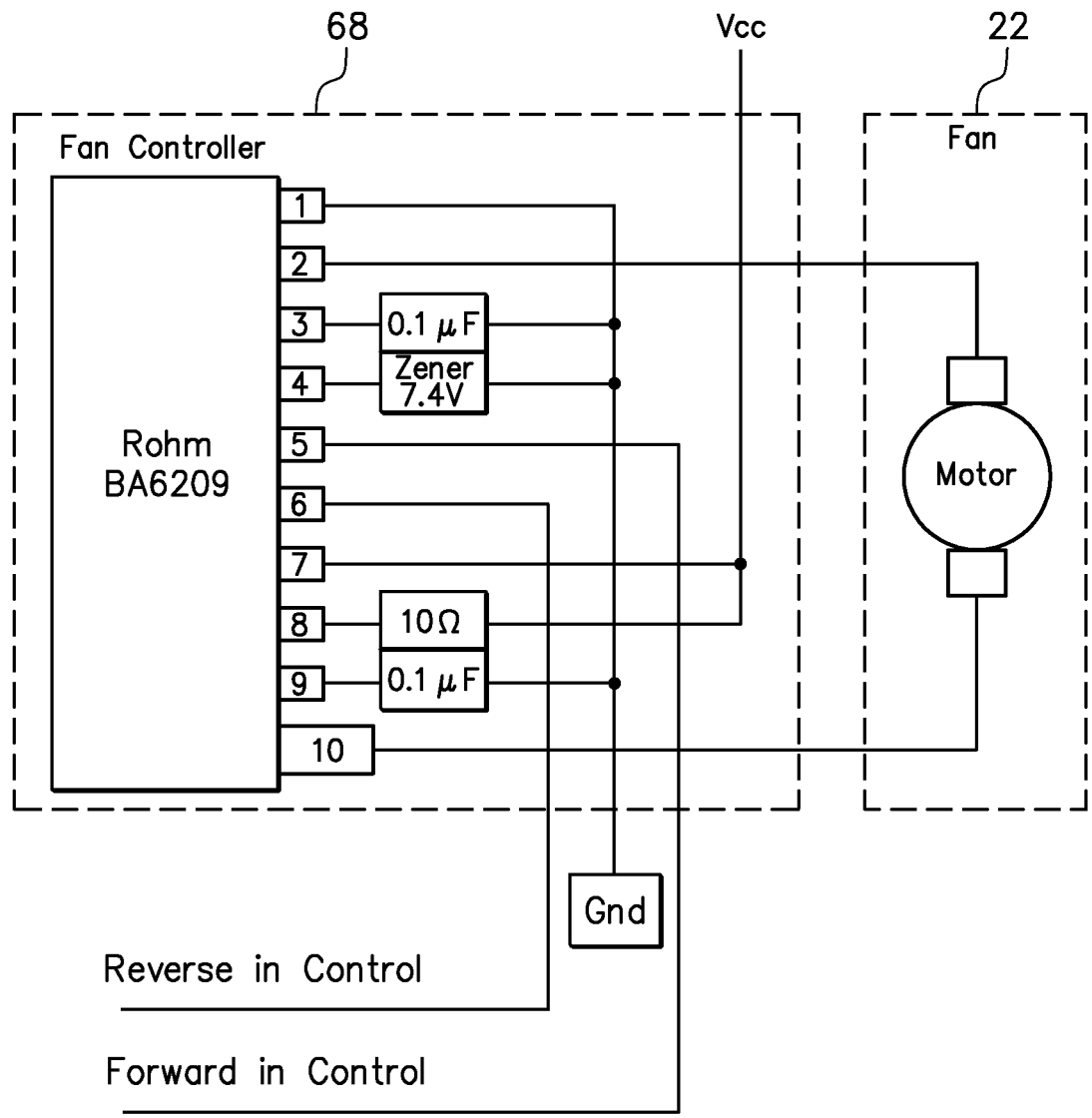
FIG. 7 is a diagram of a fan controller and a reversible rotary fan.

FIG. 7 is a diagram of a fan controller 68 and a reversible rotary fan 22. A "reverse in control" or a "forward in control" signal from a service processor instructs the fan controller which direction to run the fan. The fan controller is also responsible for the normal control of the fan speed. The fan controller may include a lock-out mechanism in the circuit to prevent both the forward and reverse controls from being active at the same time.

Figure 8:
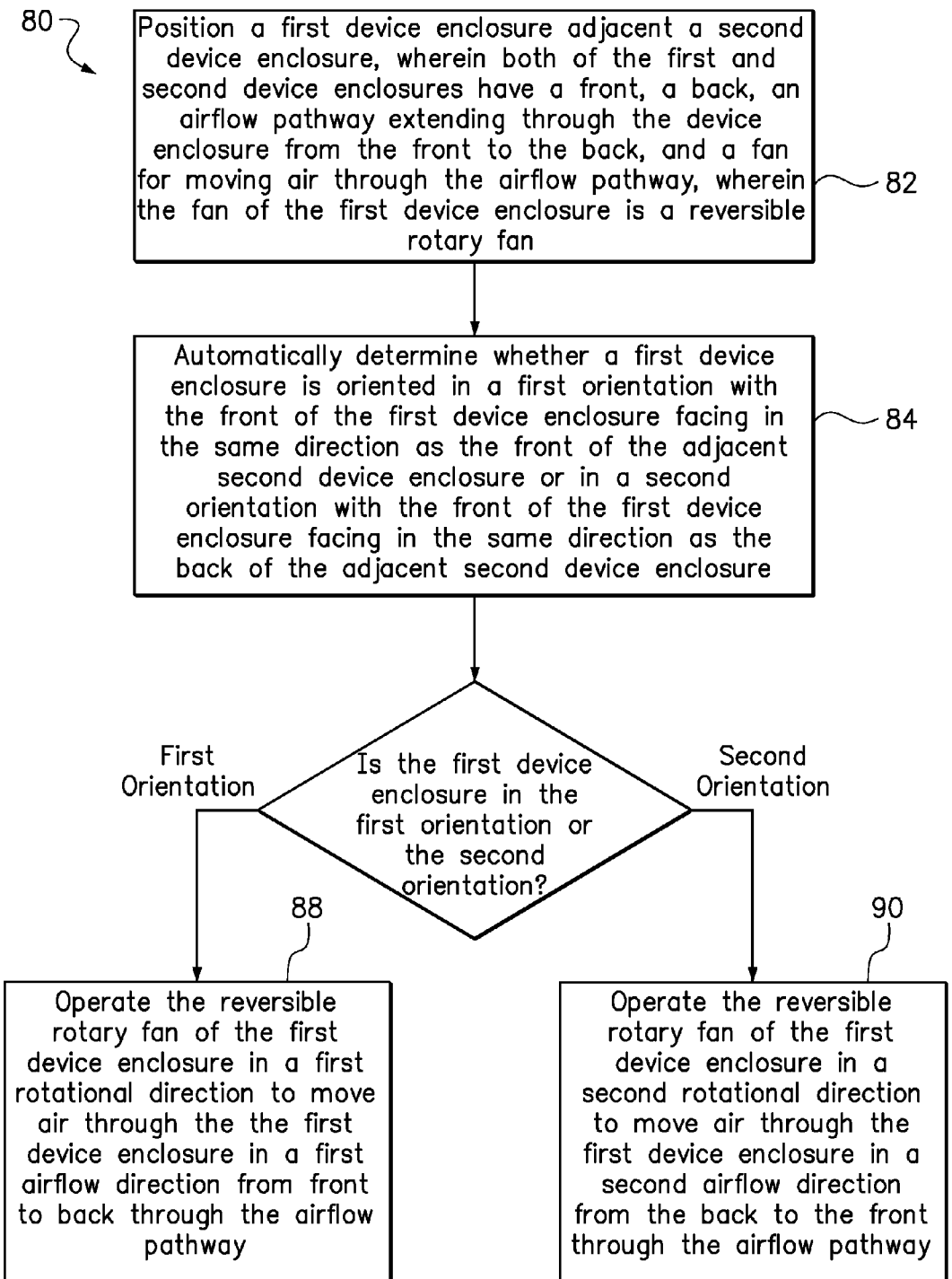
FIG. 8 is a flowchart of a method for controlling the airflow direction through a device enclosure.

FIG. 8 is a flowchart of a method 80 for controlling the airflow direction through a device enclosure. In step 82, a first device enclosure is positioned adjacent a second device enclosure, wherein both of the first and second device enclosures have a front, a back, an airflow pathway extending through the device enclosure from the front to the back, and a fan for moving air through the airflow pathway, and wherein the fan of the first device enclosure is a reversible rotary fan. In step 84, it is automatically determined whether a first device enclosure is oriented in a first orientation with the front of the first device enclosure facing in the same direction as the front of the adjacent second device enclosure or in a second orientation with the front of the first device enclosure facing in the same direction as the back of the adjacent second device enclosure. If step 84 determined that the first device enclosure is in the first orientation, then step 88 causes the reversible rotary fan of the first device enclosure to operate in a first rotational direction to move air through the first device enclosure in a first airflow direction from front to back through the airflow pathway. If step 84 determined that the first device enclosure is in the second orientation, then step 90 causes the reversible rotary fan of the first device enclosure to operate in a second rotational direction to move air through the first device enclosure in a second airflow direction from the back to the front through the airflow pathway.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   automatically determining whether a first device enclosure is oriented in a first orientation with a front of the first device enclosure facing in the same direction as a front of an adjacent second device enclosure or in a second orientation with the front of the first device enclosure facing in the same direction as a back of the adjacent second device enclosure;
   operating a reversible rotary fan of the first device enclosure in a first rotational direction to move air through the first device enclosure in a first airflow direction from front to back through an airflow pathway extending through the first device enclosure in response to determining that the first device enclosure is in the first orientation; and
   operating the reversible rotary fan of the first device enclosure in a second rotational direction to move air through the first device enclosure in a second airflow direction from the back to the front through the airflow pathway in response to determining that the first device enclosure is in the second orientation;
   wherein automatically determining whether the first device enclosure is oriented in the first orientation or in the second orientation, includes: transmitting a first near-field communication signal from a first transceiver positioned on the first device enclosure to a second transceiver positioned on the adjacent second device enclosure at a first time, receiving a second near-field communication signal at the first transceiver from the second transceiver at a second time, determining that the first device enclosure is oriented in the first orientation in response to the time delay between the first time and the second time being less than a predetermined amount of time, and determining that the first device enclosure is oriented in the second orientation in response to the time delay between the first time and the second time being greater than a predetermined amount of time.

2. The method of claim 1, wherein the reversible rotary fan of the first device enclosure maintains airflow through the first device enclosure from a cold aisle to a hot aisle flow regardless of whether the first device enclosure is in the first orientation or the second orientation.

3. The method of claim 1, wherein the first device enclosure houses a network switch.

4. The method of claim 1, wherein the first device enclosure houses a network switch and the adjacent device enclosure houses a server.

5. The method of claim 1, wherein the first device enclosure and the adjacent second device enclosure are positioned in a rack, the method further comprising:
identifying a first rack position of the first device enclosure.

6. The method of claim 1, wherein either the first transceiver is positioned at the front of the first device enclosure and the second transceiver is positioned at the front of the second device enclosure, or the first transceiver is positioned at the back of the first device enclosure and the second transceiver is positioned at the back of the second device enclosure.

7. The method of claim 1, wherein each near-field communication signal includes a characteristic that identifies the position of a near-field communication transceiver that generated the near-field communication signal.

8. The method of claim 7, wherein each near-field communication signal includes a characteristic that identifies a rack position of the device enclosure that includes the near-field communication transceiver that generated the near-field communication signal.

9. The method of claim 8, wherein the first device enclosure includes one or more near-field communication transceiver along a top of the first device enclosure for transmitting and receiving near-field communication signals with a near-field transceiver on a device enclosure adjacent the top of the first device enclosure, and wherein the first device enclosure includes one or more near-field communication transceiver along a bottom of the first device enclosure for transmitting and receiving near-field communication signals with a near-field transceiver on a device enclosure adjacent the bottom of the first device enclosure.

10. The method of claim 9, wherein each device enclosure has a near-field communication transmitter located in four corners of the device enclosure.

11. The method of claim 9, wherein each device enclosure has a near-field communication transmitter located in front, rear, left side and right side of the device enclosure.

12. The method of claim 1, further comprising:
a management entity obtaining a system identification and the time delay from the first device enclosure, wherein the management entity is responsible for determining whether the first device enclosure is oriented in the first orientation or the second orientation.

13. The method of claim 12, further comprising:
the management entity providing a fan direction instruction to a fan controller in the first device enclosure for controlling the rotational direction of the reversible rotary fan.

14. The method of claim 1, wherein a controller within the first device enclosure determines whether the first device enclosure is oriented in the first orientation or the second orientation, and controls the rotational direction of the reversible rotary fan.

15. A method, comprising:
automatically determining whether a first device enclosure is oriented in a first orientation with a front of the first device enclosure facing in the same direction as a front of an adjacent second device enclosure or in a second orientation with the front of the first device enclosure facing in the same direction as a back of the adjacent second device enclosure;
operating a reversible rotary fan of the first device enclosure in a first rotational direction to move air through the first device enclosure in a first airflow direction from front to back through an airflow pathway extending through the first device enclosure in response to determining that the first device enclosure is in the first orientation; and
operating the reversible rotary fan of the first device enclosure in a second rotational direction to move air through the first device enclosure in a second airflow direction from the back to the front through the airflow pathway in response to determining that the first device enclosure is in the second orientation;
wherein automatically determining whether the first device enclosure is oriented in the first orientation or the second orientation, includes: measuring the air temperature at the front and back of the airflow pathway through the first device enclosure, determining that the first device enclosure is oriented in the first orientation in response to the air temperature at the front of the first device enclosure being less than the air temperature at the back of the first device enclosure, and determining that the first device enclosure is oriented in the second orientation in response to the air temperature at the front of the first device enclosure being greater than the air temperature at the back of the first device enclosure.

16. A method, comprising:
automatically determining whether a first device enclosure is oriented in a first orientation with a front of the first device enclosure facing in the same direction as a front of an adjacent second device enclosure or in a second orientation with the front of the first device enclosure facing in the same direction as a back of the adjacent second device enclosure;
operating a reversible rotary fan of the first device enclosure in a first rotational direction to move air through the first device enclosure in a first airflow direction from front to back through an airflow pathway extending through the first device enclosure in response to determining that the first device enclosure is in the first orientation; and
operating the reversible rotary fan of the first device enclosure in a second rotational direction to move air through the first device enclosure in a second airflow direction from the back to the front through the airflow pathway in response to determining that the first device enclosure is in the second orientation;
wherein automatically determining whether the first device enclosure is oriented in the first orientation or the second orientation, includes: running the reversible rotary fan in a first rotational direction to move air through the first device enclosure in a first airflow direction during a first test period and measuring one or more temperatures within the first device enclosure during the first test period, running the reversible rotary fan in a second rotational direction to move air through the first device enclosure in a second airflow direction during a second test period and measuring one or more temperatures within the first device enclosure during the second test period, determining that the first device enclosure is oriented in the first orientation in response to the one or more temperatures measured during the first test period being less than the one or more temperatures measured during the second test period, and determining that the first device enclosure is oriented in the second orientation in response to the one or more temperatures measured during the first test period being greater than the one or more temperatures measured during the second test period.

* * * * *